United States Patent
Wu et al.

(10) Patent No.: US 9,039,910 B2
(45) Date of Patent: May 26, 2015

(54) METHODS AND APPARATUS FOR CONTROLLING PHOTORESIST LINE WIDTH ROUGHNESS

(75) Inventors: Banqiu Wu, Sunnyvale, CA (US); Ajay Kumar, Cupertino, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 82 days.

(21) Appl. No.: 13/276,496

(22) Filed: Oct. 19, 2011

(65) Prior Publication Data

US 2012/0103939 A1   May 3, 2012

Related U.S. Application Data

(60) Provisional application No. 61/407,209, filed on Oct. 27, 2010.

(51) Int. Cl.
| | | |
|---|---|---|
| *C23F 1/00* | (2006.01) | |
| *C23F 1/08* | (2006.01) | |
| *H01L 21/027* | (2006.01) | |
| *H01J 37/32* | (2006.01) | |
| *H01L 21/311* | (2006.01) | |

(52) U.S. Cl.
CPC ....... *H01L 21/0273* (2013.01); *H01J 37/32192* (2013.01); *H01J 37/3266* (2013.01); *H01J 37/32678* (2013.01); *H01J 2237/3343* (2013.01); *H01L 21/31138* (2013.01)

(58) Field of Classification Search
None
See application file for complete search history.

(56) References Cited

U.S. PATENT DOCUMENTS

| | | | |
|---|---|---|---|
| 4,778,561 A | 10/1988 | Ghanbari | |
| 4,877,509 A | 10/1989 | Ogawa et al. | |
| 5,133,826 A | 7/1992 | Dandl | |
| 5,366,586 A | 11/1994 | Samukawa | |
| 5,463,226 A | 10/1995 | Matsuzaki et al. | |
| 5,534,109 A | 7/1996 | Fujiwara et al. | |
| 6,196,155 B1 | 3/2001 | Setoyama et al. | |
| 6,551,445 B1 | 4/2003 | Yokogawa et al. | |
| 7,662,542 B2 | 2/2010 | Shiobara et al. | |
| 2004/0026412 A1* | 2/2004 | Brande et al. | 219/601 |
| 2004/0084150 A1* | 5/2004 | George et al. | 156/345.39 |
| 2005/0158650 A1 | 7/2005 | Yueh et al. | |
| 2006/0237127 A1 | 10/2006 | Inatomi | |
| 2006/0290287 A1 | 12/2006 | Kuninaka | |
| 2007/0003864 A1 | 1/2007 | Wagner et al. | |

(Continued)

FOREIGN PATENT DOCUMENTS

KR  20010063725 A  7/2001

OTHER PUBLICATIONS

PCT international search report and written opinion of PCT/US2011/054288 dated May 4, 2011.

*Primary Examiner* — Allan Olsen
(74) *Attorney, Agent, or Firm* — Patterson & Sheridan, LLP

(57) ABSTRACT

The present invention provides methods and an apparatus for controlling and modifying line width roughness (LWR) of a photoresist layer. In one embodiment, an apparatus for controlling a line width roughness of a photoresist layer disposed on a substrate includes a chamber body having a top wall, side wall and a bottom wall defining an interior processing region, a microwave power generator coupled to the to the chamber body through a waveguild, and one or more coils or magnets disposed around an outer circumference of the chamber body adjacent to the waveguide, and a gas source coupled to the waveguide through a gas delivery passageway.

13 Claims, 4 Drawing Sheets

(56) References Cited

U.S. PATENT DOCUMENTS

| | | | |
|---|---|---|---|
| 2007/0049048 A1* | 3/2007 | Rauf et al. | 438/775 |
| 2008/0144050 A1 | 6/2008 | Shyu et al. | |
| 2008/0145797 A1* | 6/2008 | Verbeke et al. | 430/322 |
| 2008/0182419 A1 | 7/2008 | Yasui et al. | |
| 2008/0286697 A1* | 11/2008 | Verhaverbeke et al. | 430/322 |
| 2010/0055911 A1 | 3/2010 | Fujihara | |
| 2010/0231130 A1 | 9/2010 | Labetski et al. | |
| 2012/0103939 A1* | 5/2012 | Wu et al. | 216/70 |

\* cited by examiner

METHODS AND APPARATUS FOR CONTROLLING PHOTORESIST LINE WIDTH ROUGHNESS

CROSS-REFERENCE TO RELATED APPLICATIONS

This application claims benefit of U.S. Provisional Application Ser. No. 61/407,209 filed Oct. 27, 2010, which is incorporated by reference in their entirety.

BACKGROUND

1. Field of the Invention

The present invention generally relates to methods and apparatus for controlling photoresist line width roughness and, more specifically, to methods and apparatus for controlling photoresist line width roughness in semiconductor processing technologies.

2. Description of the Related Art

Integrated circuits have evolved into complex devices that can include millions of components (e.g., transistors, capacitors and resistors) on a single chip. The evolution of chip designs continually requires faster circuitry and greater circuit density. The demands for greater circuit density necessitate a reduction in the dimensions of the integrated circuit components.

As the dimensions of the integrated circuit components are reduced (e.g. to sub-micron dimensions), more elements are required to be put in a given area on a semiconductor integrated circuit. Accordingly, lithography process has become more and more challenging to transfer even smaller features onto a substrate precisely and accurately without damage. In order to transfer precise and accurate features onto a substrate, a desired high resolution lithography process requires having a suitable light source that may provide a radiation at a desired wavelength range for exposure. Furthermore, the lithography process requires transferring features onto a photoresist layer with minimum photoresist line width roughness (LWR). After all, a defect-free photomask is required to transfer desired features onto the photoresist layer. Recently, an extreme ultraviolet (EUV) radiation source has been utilized to provide short exposure wavelengths so as to provide a further reduced minimum printable size on a substrate. However, at such small dimensions, the roughness of the edges of a photoresist layer has become harder and harder to control.

FIG. 1 depicts an exemplary top sectional view of a substrate 100 having a patterned photoresist layer 104 disposed on a target material 102 to be etched. Openings 106 are defined between the patterned photoresist layer 104 readily to expose the underlying target material 102 for etching to transfer features onto the target material 102. However, inaccurate control or low resolution of the lithography exposure process may cause in poor critical dimension of the photoresist layer 104, thereby resulting in unacceptable line width roughness (LWR) 108. Large line width roughness (LWR) 108 of the photoresist layer 104 may result in inaccurate feature transfer to the target material 102, thus, eventually leading to device failure and yield loss.

Therefore, there is a need for a method and an apparatus to control and minimize line width roughness (LWR) so as to obtain a patterned photoresist layer with desired critical dimensions.

SUMMARY

The present invention provides methods and an apparatus for controlling and modifying line width roughness (LWR) of a photoresist layer. In one embodiment, an apparatus for controlling a line width roughness of a photoresist layer disposed on a substrate includes a chamber body having a top wall, side wall and a bottom wall defining an interior processing region, a microwave power generator coupled to the chamber body through a waveguide, and one or more coils or magnets disposed around an outer circumference of the chamber body adjacent to the waveguide, and a gas source coupled to the waveguide through a gas delivery passageway.

In another embodiment, a method for controlling line width roughness of a photoresist layer disposed on a substrate includes generating an electric field in a processing chamber having a substrate disposed therein, wherein the substrate has a patterned photoresist layer disposed thereon, supplying a gas mixture to the patterned photoresist layer disposed on the substrate, generating a magnetic field to interact with the electric field in the processing chamber to form a plasma in the gas mixture, and trimming an edge profile of the patterned photoresist layer with the plasma formed in the processing chamber.

In yet another embodiment, a method for controlling line width roughness of a photoresist layer disposed on a substrate includes supplying a gas mixture into a processing chamber having a substrate disposed therein, wherein the substrate has a patterned photoresist layer disposed thereon, applying a microwave power to the processing chamber to generate an electric field in the processing chamber, applying DC or AC power to one or more coils or magnets disposed around an outer circumference of the processing chamber to generate the magnetic field, forming a plasma in the gas mixture by the interaction of the magnetic field and the electric field, and trimming an edge profile of the patterned photoresist layer using the plasma formed in the processing chamber.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION

Embodiments of the present invention include methods and apparatus for controlling line width roughness (LWR) of a photoresist layer disposed on a substrate. The line width roughness (LWR) of a photoresist layer may be controlled by performing an electron cyclotron resonance (ECR) plasma process on a photoresist layer after an exposure/development process. The electron cyclotron resonance (ECR) plasma process is performed to provide a chemical and electron grinding process in a nanometer scale to smooth the edge of the photoresist layer pattern, thereby providing a smooth pattern edge of the photoresist layer with minimum pattern edge roughness for the subsequent etching process.

Figure 2:
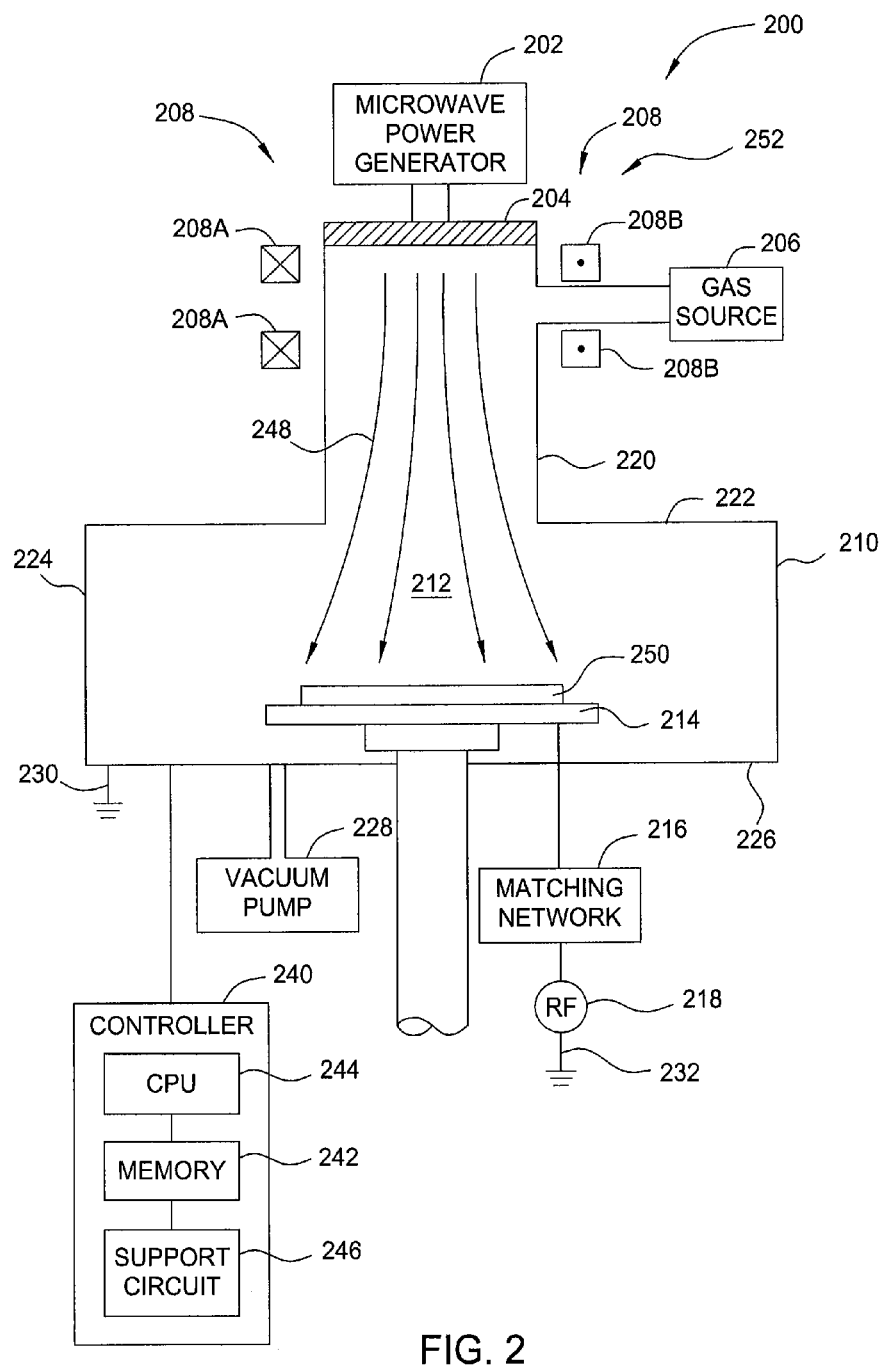
FIG. 2 depicts a schematic cross-sectional view of an electron cyclotron resonance (ECR) plasma reactor used according to one embodiment of the invention.

FIG. 2 depicts a schematic, cross-sectional diagram of one embodiment of a electron cyclotron resonance (ECR) plasma reactor 200 suitable for performing an electron cyclotron resonance (ECR) plasma process according to the present invention. One such etch reactor suitable for performing the invention may be available from Applied Materials, Inc., of Santa Clara, Calif. It is contemplated that other suitable plasma process chamber may also be employed herein, including those from other manufacturers.

The plasma reactor 200 includes a process chamber 252 having a chamber body 210. The process chamber 252 is a high vacuum vessel having a vacuum pump 228 coupled thereto. The chamber body 210 of the process chamber 252 includes a top wall 222, a sidewall 224 and a bottom wall 226 defining an interior processing region 212 therein. The temperature of the sidewall 224 is controlled using liquid-containing conduits (not shown) that are located in and/or around the sidewall 224. The bottom wall 226 is connected to an electrical ground 230.

The process chamber 252 includes a support pedestal 214. The support pedestal 214 extends through the bottom wall 226 of the processing chamber 252 into the processing region 212. The support pedestal 214 may receive a substrate 250 to be disposed thereon for processing. The support pedestal 214 is coupled to a radio frequency (RF) bias power source 218 through a matching network 216 to an electrical ground 232. The bias power source 218 is generally capable of producing an RF signal having a tunable frequency of from about 50 kHz to about 60 MHz and a bias power of about 0 to 5,000 Watts. Optionally, the bias power source 218 may be a DC or pulsed DC source.

A microwave power generator 202 couples power to the processing region 212 of the processing chamber 252 through a waveguide 220. A dielectric window 204 may be disposed between the microwave power generator 202 and the waveguide 220. In one embodiment, the dielectric window 204 may be manufactured from quartz glass, ceramic materials or the like.

Figure 1:
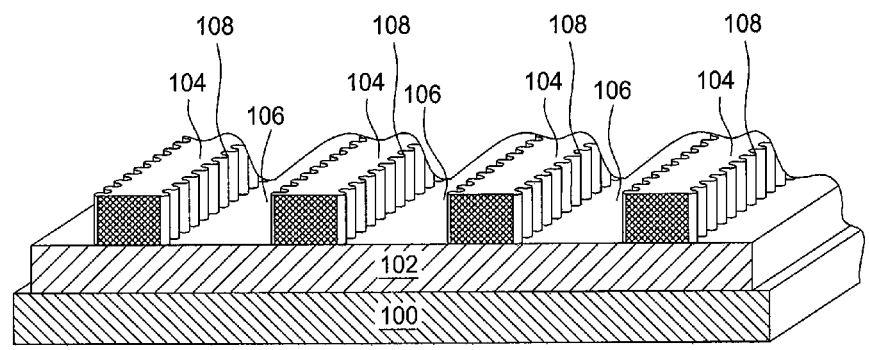
FIG. 1 depicts a top view of an exemplary structure of a patterned photoresist layer disposed on a substrate conventionally in the art.
Figure 3:
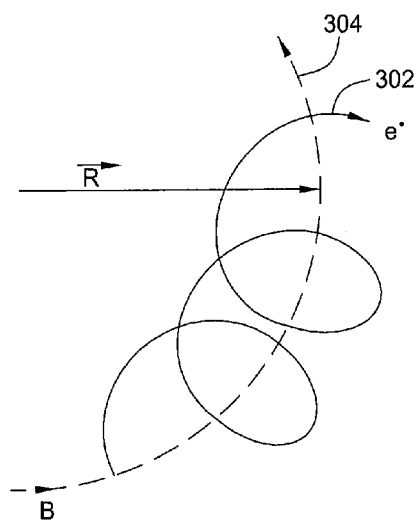
FIG. 3 depicts an electron trajectory diagram according to one embodiment of the invention.

One or more coil segments or magnets 208 (shown as 208A and 208B) are disposed around an outer circumference of the processing chamber 252. Power to the coil segment(s) or magnets 208 is controlled by a DC power source or a low-frequency AC power source (not shown). The coil segments or magnets 208 are generally spaced-apart in a symmetric pattern and are arranged with alternating polarities (i.e., alternating north "N" and south "S"). The coil segments or magnets 208 disposed around the circumference of the processing chamber 252 will tend to "push" the plasma generated toward the middle of the circular region in the interior processing region 212. The coil segments or magnets 208 generate the magnetic field in a direction perpendicular to an electric filed where the microwave is introduced into the processing chamber 252. The coil segments or magnets 208 may comprise permanent magnets, electromagnets or other similar devices that are able to generate magnetic filed and shape the generated fields in the interior processing region 212. A gas source 206 may be coupled to the waveguide 220 to deliver processing gas into the processing chamber 252. The magnetic field causes the electrons to orbit along the magnetic field lines 248 while microwave power energizes the electrons as the electrons orbit. The interaction between the electric field and magnetic field causes the gas supplied from the gas source 206 to be dissociated and forming an electron cyclotron resonance (ECR) plasma. The ECR plasma may include magnetic field, free charges, such as electrons and ions, radicals, or neutral atoms, which may spin and move toward to the substrate surface 250. The spin electrons, combined with the dissociated ions or charges from the gas mixture, may be accelerated toward the substrate surface in a circular mode along the magnetic field line 248 so as to grind the structures formed on the substrate surface. Referring first to FIG. 3, FIG. 3 depicts an electron trajectory 302 in a magnetic field. As the magnetic field may cause the electrons to spin and whirl along the magnetic line 304 in the interior processing region 212, the electrons may be moved in a circular motion 302 toward the substrate surface.

Referring back to FIG. 2, the coil segments or magnets 208 may be moved longitudinally along an axis of the processing chamber 252 to adjust the axial location of the maximum point of the magnetic field generated in the interior processing region 212. Other magnetic field source capable of generating sufficient magnetic field strength to promote forming ECR plasma may also be used.

During substrate processing, gas pressure within the interior of the chamber 252 may be controlled in a predetermined range. In one embodiment, the gas pressure within the interior processing region 212 of the chamber 252 is maintained at about 0.1 to 999 mTorr. The substrate 250 may be maintained at a temperature of between about 10 to about 500 degrees Celsius.

A controller 240, including a central processing unit (CPU) 244, a memory 242, and support circuits 246, is coupled to the various components of the reactor 202 to facilitate control of the processes of the present invention. The memory 242 can be any computer-readable medium, such as random access memory (RAM), read only memory (ROM), floppy disk, hard disk, or any other form of digital storage, local or remote to the reactor 200 or CPU 244. The support circuits 246 are coupled to the CPU 244 for supporting the CPU 244 in a conventional manner. These circuits include cache, power supplies, clock circuits, input/output circuitry and subsystems, and the like. A software routine or a series of program instructions stored in the memory 242, when executed by the CPU 244, causes the reactor 200 to perform a plasma process of the present invention.

FIG. 2 only shows one exemplary configuration of various types of plasma reactors that can be used to practice the invention. For example, different types of microwave power, magnetic power and bias power can be coupled into the plasma chamber using different coupling mechanisms. In some applications, different types of plasma may be generated in a different chamber from the one in which the substrate is located, e.g., remote plasma source, and the plasma subsequently guided into the chamber using techniques known in the art.

Figure 4:
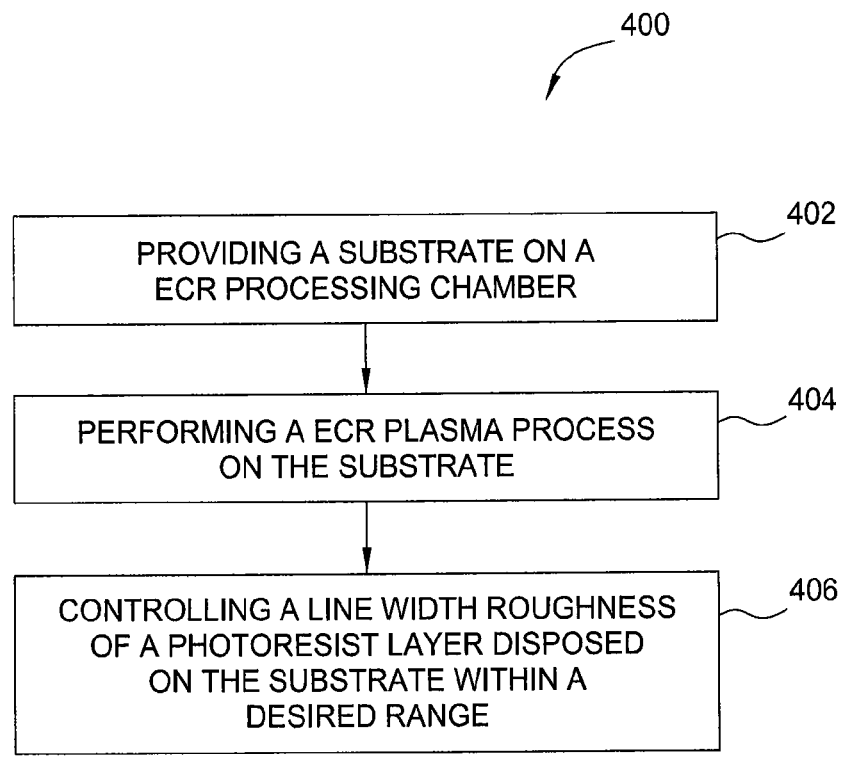
FIG. 4 depicts a process flow diagram of performing a ECR plasma process on a substrate according to one embodiment of the invention.

FIG. 4 illustrates a flow diagram of one embodiment of performing a photoresist line width roughness (LWR) control process 400 according to one embodiment of the invention. The process 400 may be stored in memory 242 as instructions that executed by the controller 240 to cause the process 400 to be performed in a ECR plasma processing chamber, such as the ECR plasma reactor 200 depicted in FIG. 2 or other suitable reactors.

Figure 5:
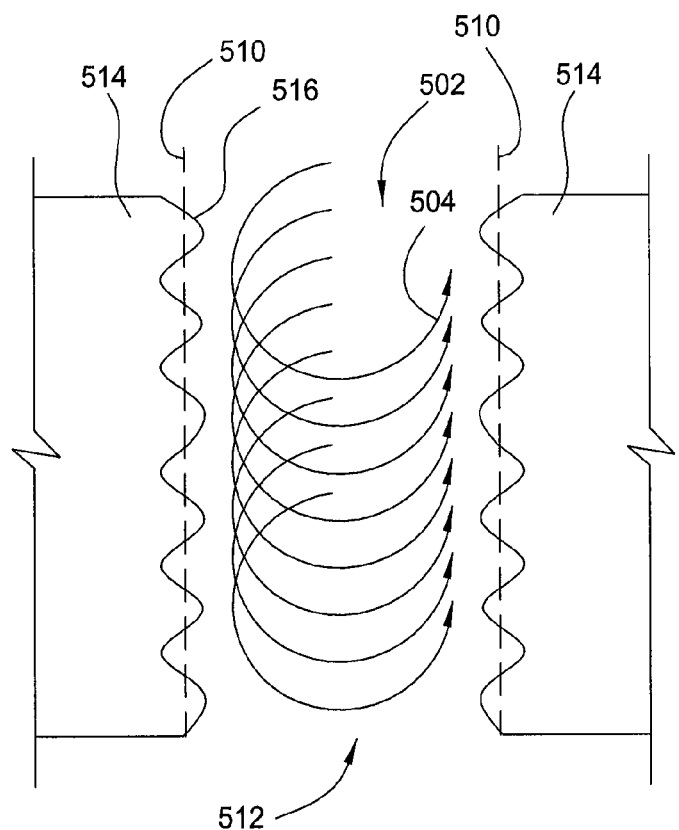
FIG. 5 depicts a top view of electron trajectories traveled adjacent to a photoresist layer according to one embodiment of the present invention.

The process 400 begins at a block 402 by providing a substrate, such as the substrate 250 depicted in FIG. 2, to the processing chamber 252 for processing. The substrate 250 may have a target material 512 to be etched disposed thereon, as shown in FIG. 5. In one embodiment, the target material 512 to be etched using the photoresist line width roughness (LWR) control process 400 may be a dielectric layer, a metal layer, a ceramic material, or other suitable material. In one embodiment, the target material 512 to be etched may be a dielectric material formed as a gate structure or a contact structure or an inter-layer dielectric structure (ILD) utilized in semiconductor manufacture. Suitable examples of the dielectric material include $SiO_2$, SiON, SiN, SiC, SiOC, SiOCN, a-C, or the like. In another embodiment, the target material 512 to be etched may be a metal material formed as an inter-metal dielectric structure (IMD) or other suitable structures. Suitable examples of metal layers include Cu, Al, W, Ni, Cr, or the like.

At block 404, a photoresist line width roughness (LWR) control process 400 may be performed on the substrate 250 to grind, modify and trim edges 516 of the photoresist layer 514, as shown in FIG. 5. The photoresist line width roughness (LWR) control process 400 is performed by conducting an ECR plasma process on the photoresist layer 514 disposed on the substrate 250 in an ECR processing chamber. As discussed above, electrons excited in an ECR plasma process are moved and accelerated in a circular motion. As depicted in FIG. 5, the circular movement 504 of the electrons may smoothly grind, collide, and polish away the uneven edges 516 of the photoresist layer 514. The process may be continuously performed until a desired degree of roughness, e.g, straightness, (as shown by imaginary line 510) of photoresist layer 514 is achieved. By a good control of the electron momentum, the uneven surfaces and protrusions from edges 516 of the photoresist layer 514 may be gradually flattened out, thereby efficiently controlling the photoresist line width roughness (LWR) within a desired minimum range. The electron momentum, ion density, ion mass, or charge concentration may be controlled by the power generated from the interaction between the magnetic field and the electric field and the gases supplied thereto. In one embodiment, by adjusting the power supplied to generate the microwave field and the magnetic field, different electron momentum or mobility may be obtained.

At block 406, the line width roughness (LWR) of the photoresist layer 514 may be adjusted, grinded, modified, controlled during the ECR plasma process. During processing, several process parameters may be controlled to maintain the line width roughness of the photoresist layer 514 at a desired range. In one embodiment, the microwave power may be supplied to the processing chamber between about 50 Watt and about 2000 Watt. The magnetic field generated in the processing chamber may be controlled between about 500 G and about 1000 G. A DC and/or AC power between about 100 Watt and about 2000 Watt may be used to generate magnetic field in the processing chamber. The pressure of the processing chamber may be controlled at between about 0.5 milliTorr and about 500 milliTorr. A processing gas may be supplied into the processing chamber to assist modifying, trimming, and controlling the edge roughness of the photoresist layer 514. As the materials selected for the photoresist layer 514 are often organic materials, an oxygen containing gas may be selected as the processing gas to be supplied into the processing chamber to assist grinding and modifying the roughness and profile of the photoresist layer 514. Suitable examples of the oxygen containing gas include $O_2$, $N_2O$, $NO_2$, $O_3$, $H_2O$, CO, $CO_2$, and the like. Other types of processing gas may also be supplied into the processing chamber, simultaneously or individually, to assist modifying the roughness of the photoresist layer 514. Suitable examples of the processing gas include $N_2$, $NH_3$, $Cl_2$ or inert gas, such as Ar or He. The processing gas may be supplied into the processing chamber at a flow rate between about 10 sccm to about 500 sccm, for example, about between about 100 sccm to about 200 sccm. The process may be performed between about 30 second and about 200 second. In one particular embodiment, the $O_2$ gas is supplied as the processing gas into the processing chamber to react with the photoresist layer 514 so as to trim and modify the line width roughness (LWR) of the photoresist layer 514 disposed on the substrate 250.

As discussed above, in one embodiment, by adjusting the power supplied to generate the microwave field and the magnetic field, different electron momentum or mobility may be obtained, thereby providing different collision energy to modify or trim the edge roughness of the photoresist layer. In the embodiment wherein a higher electron movement momentum is desired, a higher power may be supplied to generate the microwave field and the magnetic field, thereby providing a higher collision energy to trim and modify the roughness of the photoresist layer. In contrast, in the embodiment wherein a lower electron movement momentum is desired, a lower power may be supplied to generate the microwave field and the magnetic field, thereby providing lower collision energy to just gently smooth and polish the roughness of the photoresist layer as needed without etching the underlying layer.

The photoresist line width roughness (LWR) control process 400 may be continuously performed until a desired minimum roughness of the photoresist layer 514 is achieved. In one embodiment, line width roughness 513 of the photoresist layer 514 may be controlled in a range less than about 3.0 nm, such as between about 1.0 nm and about 1.5 nm. The photoresist line width roughness (LWR) control process 400 may be terminated after reaching an endpoint signaling indicating a desired roughness of the photoresist layer 514 is achieved. Alternatively, the photoresist line width roughness (LWR) control process 400 may be terminated by a preset time mode. In one embodiment, the photoresist line width roughness (LWR) control process 400 may be performed for between about 100 seconds and between about 500 seconds.

Figure 6:
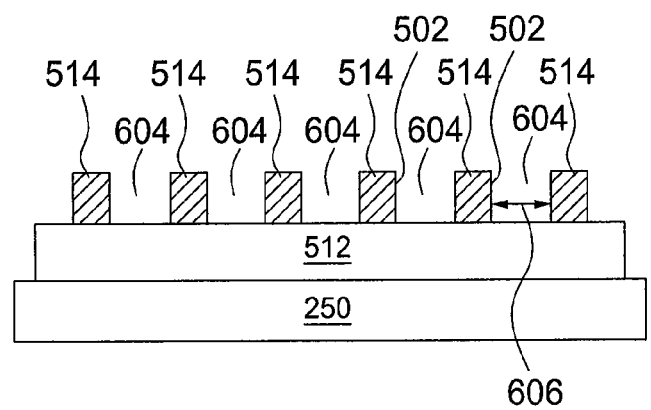
FIG. 6 depicts a profile of a line width roughness of a photoresist layer disposed on a substrate according to one embodiment of the invention.

FIG. 6 depicts an exemplary embodiment of a cross sectional view of the photoresist layer 514 already having the photoresist line width roughness (LWR) control process 400 performed thereon. After the photoresist line width roughness (LWR) control process 400, a smooth edge surface is obtained. The roughness of the photoresist layer 514 is smoothed out and trimmed in a manner to minimize the edge roughness and smooth the edge morphology of the photoresist layer 514. The smooth edge surface formed in the photoresist layer 514 defines a sharp and well defined opening 604 in the patterned photoresist layer 514 to expose the underlying target material 512 for etching, thereby etching a precise and straight opening width 606 to be formed as a mask layer. In one embodiment, the width 606 of the openings 604 may be controlled between about 15 nm and about 35 nm.

In one embodiment, the underlying target material 512 may be etched by an etching process performed in the same chamber used to perform the line width roughness (LWR)

control process, such as the chamber 200 depicted in FIG. 2. In another embodiment, the underlying target material 512 may be etched by an etching process performed in any other different suitable etching chamber integrated in a cluster system where the line width roughness (LWR) process chamber may be incorporated thereto. In yet another embodiment, the underlying target material 512 may be etched by an etching process performed in any other different suitable etching chamber, including stand-alone chamber separated from the line width roughness (LWR) process chamber or separated from a cluster system where the line width roughness (LWR) process chamber may be incorporated thereto.

In one embodiment, the gas mixture utilized to perform the line width roughness (LWR) process is configured to be different from the gas mixture utilized to etch the underlying target material 512. In one embodiment, the gas mixture utilized to perform the line width roughness (LWR) process includes an oxygen containing layer, such as $O_2$, and the gas mixture utilized to etch the underlying target material 512 includes a halogen containing gas, such as fluorine carbon gas, chlorine containing gas, bromide containing gas, fluorine containing gas, and the like.

Thus, the present invention provides methods and an apparatus for controlling and modifying line width roughness (LWR) of a photoresist layer. The method and apparatus can advantageously control, modify and trim the profile, line width roughness and dimension of the photoresist layer disposed on a substrate after a EUV light exposure process, thereby providing accurate critical dimension control of an opening in the photoresist layer so the subsequent etching process may have accurately transfer critical dimensions to the underlying layer being etched through the opening.

While the foregoing is directed to embodiments of the present invention, other and further embodiments of the invention may be devised without departing from the basic scope thereof, and the scope thereof is determined by the claims that follow.

What is claimed is:

1. A method for controlling line width roughness of a photoresist layer disposed on a substrate comprising:
    after a photoresist layer has been patterned on a substrate to form openings, generating an electric field from a microwave power generator in a waveguide formed in a processing chamber having the substrate disposed therein, the waveguide having a first end closed by a dielectric window formed as a lid of the processing chamber and a second end facing the substrate, the window exposed to the substrate through the waveguide;
    supplying a gas mixture into the first end of waveguide, the gas mixture flowing through the waveguide toward the substrate to the patterned photoresist layer in an uninterrupted flow path;
    interacting the electric field perpendicularly with a magnetic field generated in the waveguide, wherein the electric field has an uninterrupted path between the first end and the second end of the waveguide;
    forming a plasma in the gas mixture toward the substrate; and
    trimming an edge profile of the patterned photoresist layer with the plasma formed in the processing chamber.

2. The method of claim 1, wherein generating the electric field further comprises:
    applying a microwave power through the dielectric window to the processing chamber to generate the electric field.

3. The method of claim 1, wherein generating the magnetic field further comprising:
    applying a DC or AC power to one or more coils or magnets disposed around the outer circumference of the processing chamber to generate the magnetic field.

4. The method of claim 3, wherein the coils or magnets are permanent magnets or electromagnets.

5. The method of claim 1, wherein supplying the gas mixture further comprises:
    supplying an oxygen containing gas into the processing chamber.

6. The method of claim 5, wherein the oxygen containing gas is $O_2$.

7. The method of claim 1, wherein trimming the edge profile of the patterned photoresist layer further comprising:
    adjusting the interaction between the magnetic field and the electric field generated in the processing chamber.

8. The method of claim 7, wherein adjusting the interaction further comprises:
    controlling the edge profile of the photoresist layer having a line width roughness less than about 3.0 nm.

9. The method of claim 1, further comprising:
    supplying a RF bias power to the substrate through a substrate support assembly disposed in the processing chamber.

10. The method of claim 1, further comprising:
    etching the substrate using the trimmed patterned photoresist layer as an etching mask.

11. A method for controlling line width roughness of a photoresist layer disposed on a substrate comprising:
    after a photoresist layer has been patterned on a substrate to form openings, supplying a gas mixture through a waveguide in an uninterrupted flow path into a processing chamber having the substrate disposed therein;
    applying a microwave power from a microwave power generator through a dielectric window to the processing chamber to generate an electric field in the waveguide in the processing chamber, the waveguide having a first end closed by the dielectric window formed as a lid of the processing chamber and a second end facing the substrate, the window exposed to the substrate through the waveguide;
    applying DC or AC power to one or more coils or magnets disposed around an outer circumference of the processing chamber to generate the magnetic field in the waveguide;
    forming a plasma in the gas mixture by the interaction of the magnetic field and the electric field with uninterrupted path in the waveguide, wherein the gas mixture is supplied into the first end of waveguide, the gas mixture flowing through the waveguide toward the substrate to the patterned photoresist layer; and
    trimming an edge profile of the patterned photoresist layer using the plasma formed in the processing chamber.

12. The method of claim 11, wherein trimming the edge profile of the patterned photoresist layer further comprises:
    controlling the edge profile of the photoresist layer having a line width roughness less than about 3.0 nm.

13. The method of claim 11, wherein supplying the gas mixture further comprises:
    supplying an oxygen containing gas into the processing chamber.

* * * * *